United States Patent
Lee

(10) Patent No.: US 10,700,113 B2
(45) Date of Patent: *Jun. 30, 2020

(54) IMAGE SENSORS WITH DIFFRACTIVE LENSES FOR STRAY LIGHT CONTROL

(71) Applicant: SEMICONDUCTOR COMPONENTS INDUSTRIES, LLC, Phoenix, AZ (US)

(72) Inventor: Byounghee Lee, Meridian, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/387,919

(22) Filed: Apr. 18, 2019

(65) Prior Publication Data

US 2019/0244994 A1 Aug. 8, 2019

Related U.S. Application Data

(63) Continuation of application No. 15/719,181, filed on Sep. 28, 2017, now Pat. No. 10,312,280.

(51) Int. Cl.
| | |
|---|---|
| *H01L 27/146* | (2006.01) |
| *G02B 3/00* | (2006.01) |
| *G02B 5/18* | (2006.01) |
| *G02B 5/20* | (2006.01) |
| *G02B 13/00* | (2006.01) |
| *G02B 27/42* | (2006.01) |
| *G02B 1/11* | (2015.01) |

(52) U.S. Cl.
CPC ...... *H01L 27/14625* (2013.01); *G02B 3/0056* (2013.01); *G02B 3/0062* (2013.01); *G02B 5/1814* (2013.01); *G02B 5/1885* (2013.01); *G02B 5/201* (2013.01); *G02B 13/0085* (2013.01); *G02B 27/4205* (2013.01); *H01L 27/1462* (2013.01); *H01L 27/14621* (2013.01); *H01L 27/14627* (2013.01); *G02B 1/11* (2013.01)

(58) Field of Classification Search
CPC .......... H01L 27/14625; H01L 27/1462; H01L 27/14621; H01L 27/14627; G02B 27/4205; G02B 1/11

See application file for complete search history.

(56) References Cited

U.S. PATENT DOCUMENTS

| | | |
|---|---|---|
| 4,878,735 A | 11/1989 | Vilums |
| 5,734,155 A | 3/1998 | Rostoker |
| (Continued) | | |

*Primary Examiner* — Julia Slutsker
(74) *Attorney, Agent, or Firm* — Treyz Law Group, P.C.; Joseph F. Guihan

(57) ABSTRACT

An image sensor may include an array of imaging pixels. Each imaging pixel may have a photosensitive area that is covered by a microlens and a diffractive lens that focuses light onto the photosensitive area. The diffractive lens may be interposed between the microlens and the photosensitive area. The diffractive lens may have a higher index of refraction than the surrounding materials. The diffractive lens may be formed as a portion of an anti-reflection coating. In some cases, multiple diffractive lenses may be formed over the imaging pixels. Focusing and defocusing diffractive lenses may be used to tune the response of the imaging pixels to incident light.

20 Claims, 10 Drawing Sheets

(56) References Cited

U.S. PATENT DOCUMENTS

| | | |
|---|---|---|
| 9,099,580 B2 | 8/2015 | Hirigoyen et al. |
| 2005/0110104 A1 | 5/2005 | Boettiger et al. |
| 2005/0242271 A1 | 11/2005 | Weng et al. |
| 2006/0145056 A1 | 7/2006 | Jung |
| 2006/0177959 A1 | 8/2006 | Boettiger |
| 2006/0292735 A1 | 12/2006 | Boettiger et al. |
| 2007/0001252 A1 | 1/2007 | Noda et al. |
| 2007/0127125 A1 | 6/2007 | Sasaki |
| 2007/0146531 A1 | 6/2007 | Toshikiyo |
| 2007/0278604 A1 | 12/2007 | Minixhofer |
| 2009/0090937 A1 | 4/2009 | Park |
| 2009/0127440 A1 | 5/2009 | Nakai |
| 2009/0160965 A1 | 6/2009 | Sorek et al. |
| 2009/0242736 A1* | 10/2009 | Rennie .............. H01L 27/14621 250/208.1 |
| 2009/0250594 A1* | 10/2009 | Tanaka .................. G02B 5/201 250/208.1 |
| 2010/0091168 A1 | 4/2010 | Igarashi |
| 2011/0096210 A1 | 4/2011 | Koshino et al. |
| 2011/0234830 A1 | 9/2011 | Kiyota et al. |
| 2013/0015545 A1 | 1/2013 | Toumiya et al. |
| 2013/0240962 A1 | 9/2013 | Wang et al. |
| 2014/0091205 A1 | 4/2014 | Takamiya |
| 2014/0197301 A1 | 7/2014 | Velichko et al. |
| 2014/0313379 A1 | 10/2014 | Mackey |
| 2015/0003777 A1* | 1/2015 | Tseng ................ H01L 27/14621 385/14 |
| 2015/0109501 A1 | 4/2015 | Sekine |
| 2016/0111461 A1 | 4/2016 | Ahn et al. |
| 2016/0112614 A1* | 4/2016 | Masuda ........... H01L 27/14621 348/374 |
| 2016/0211306 A1 | 7/2016 | Choi et al. |
| 2016/0351610 A1 | 12/2016 | Chen |
| 2016/0377871 A1 | 12/2016 | Kress et al. |
| 2017/0133420 A1 | 5/2017 | Silsby |
| 2017/0141145 A1 | 5/2017 | Yamashita et al. |
| 2017/0176787 A1 | 6/2017 | Jia et al. |
| 2018/0026065 A1 | 1/2018 | Hsieh et al. |
| 2018/0145103 A1 | 5/2018 | Hirigoyen |

* cited by examiner

IMAGE SENSORS WITH DIFFRACTIVE LENSES FOR STRAY LIGHT CONTROL

This application is a continuation of U.S. patent application Ser. No. 15/719,181, filed Sep. 28, 2017, which is hereby incorporated by reference herein in its entirety. This application claims the benefit of and claims priority to U.S. patent application Ser. No. 15/719,181, filed Sep. 28, 2017.

BACKGROUND

This relates generally to image sensors and, more particularly, to image sensors having lenses to focus light.

Image sensors are commonly used in electronic devices such as cellular telephones, cameras, and computers to capture images. In a typical arrangement, an electronic device is provided with an array of image pixels arranged in pixel rows and pixel columns. Each image pixel in the array includes a photodiode that is coupled to a floating diffusion region via a transfer gate. Each pixel receives incident photons (light) and converts the photons into electrical signals. Column circuitry is coupled to each pixel column for reading out pixel signals from the image pixels. Image sensors are sometimes designed to provide images to electronic devices using a Joint Photographic Experts Group (JPEG) format.

Conventional image sensors sometimes include a color filter element and a microlens above each pixel. The microlenses of conventional image sensors typically have curved surfaces and use refraction to focus light on an underlying photodiode. However, these types of microlenses may not focus all incident light onto the intended photodiode, leading to optical cross-talk.

To prevent optical cross-talk, conventional image sensors sometimes include light blocking structures. However, these types of structures are large in size, difficult to manufacture, and have limited performance.

It would therefore be desirable to provide improved arrangements for microlenses and image sensors to reduce cross-talk and improve image sensor performance.

DETAILED DESCRIPTION

Figure 1:
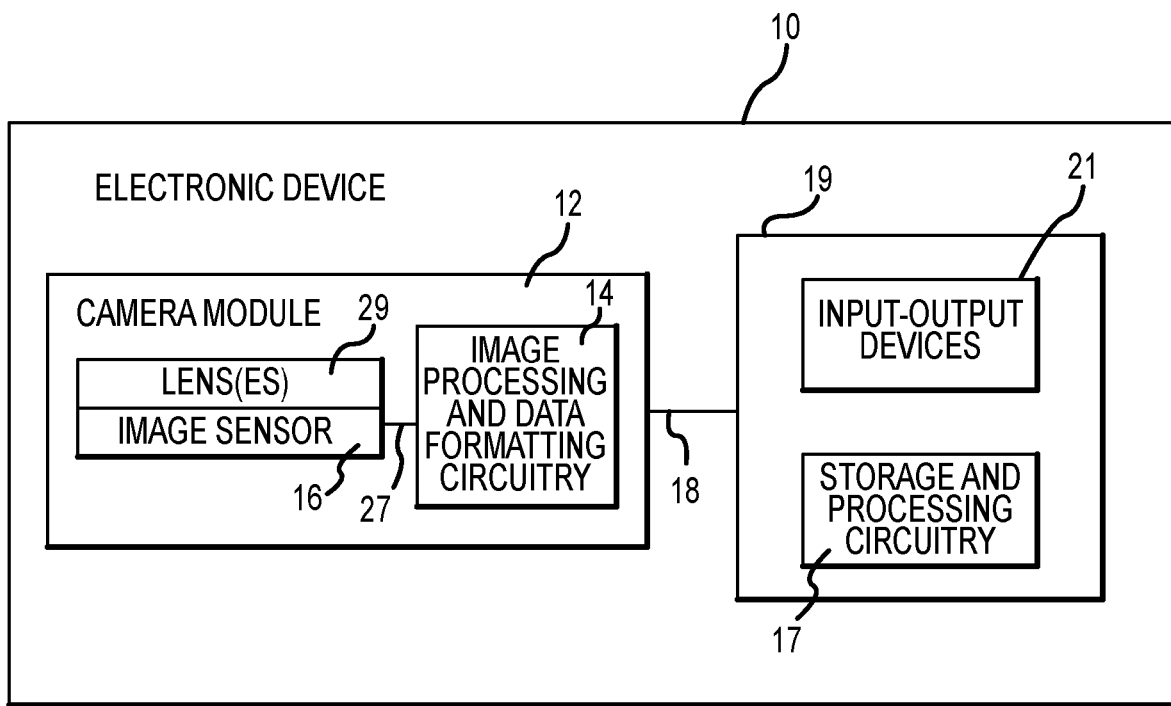
FIG. 1 is a schematic diagram of an illustrative electronic device that may include an image sensor in accordance with an embodiment.

Embodiments of the present invention relate to image sensors with pixels that include diffractive lenses for stray light control. Image sensors with diffractive lenses may be included in electronic devices. An electronic device with a digital camera module is shown in FIG. 1. Electronic device 10 may be a digital camera, a computer, a cellular telephone, a medical device, or other electronic device. Camera module 12 (sometimes referred to as an imaging device) may include image sensor 16 and one or more lenses 29. During operation, lenses 29 (sometimes referred to as optics 29) focus light onto image sensor 16. Image sensor 16 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 16 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 16 may be provided to image processing and data formatting circuitry 14 via path 27. Image processing and data formatting circuitry 14 may be used to perform image processing functions such as automatic focusing functions, depth sensing, data formatting, adjusting white balance and exposure, implementing video image stabilization, face detection, etc. For example, during automatic focusing operations, image processing and data formatting circuitry 14 may process data gathered by phase detection pixels in image sensor 16 to determine the magnitude and direction of lens movement (e.g., movement of lens 29) needed to bring an object of interest into focus.

Image processing and data formatting circuitry 14 may also be used to compress raw camera image files if desired (e.g., to Joint Photographic Experts Group or JPEG format). In a typical arrangement, which is sometimes referred to as a system on chip (SOC) arrangement, camera sensor 16 and image processing and data formatting circuitry 14 are implemented on a common integrated circuit. The use of a single integrated circuit to implement camera sensor 16 and image processing and data formatting circuitry 14 can help to reduce costs. This is, however, merely illustrative. If desired, camera sensor 14 and image processing and data formatting circuitry 14 may be implemented using separate integrated circuits. If desired, camera sensor 16 and image processing circuitry 14 may be formed on separate semiconductor substrates. For example, camera sensor 16 and image processing circuitry 14 may be formed on separate substrates that have been stacked.

Camera module 12 may convey acquired image data to host subsystems 19 over path 18 (e.g., image processing and data formatting circuitry 14 may convey image data to subsystems 19). Electronic device 10 typically provides a user with numerous high-level functions. In a computer or advanced cellular telephone, for example, a user may be provided with the ability to run user applications. To implement these functions, host subsystem 19 of electronic device 10 may include storage and processing circuitry 17 and input-output devices 21 such as keypads, input-output ports, joysticks, and displays. Storage and processing circuitry 17 may include volatile and nonvolatile memory (e.g., random-access memory, flash memory, hard drives, solid state drives, etc.). Storage and processing circuitry 17 may also include microprocessors, microcontrollers, digital signal processors, application specific integrated circuits, or other processing circuits.

Figure 2:
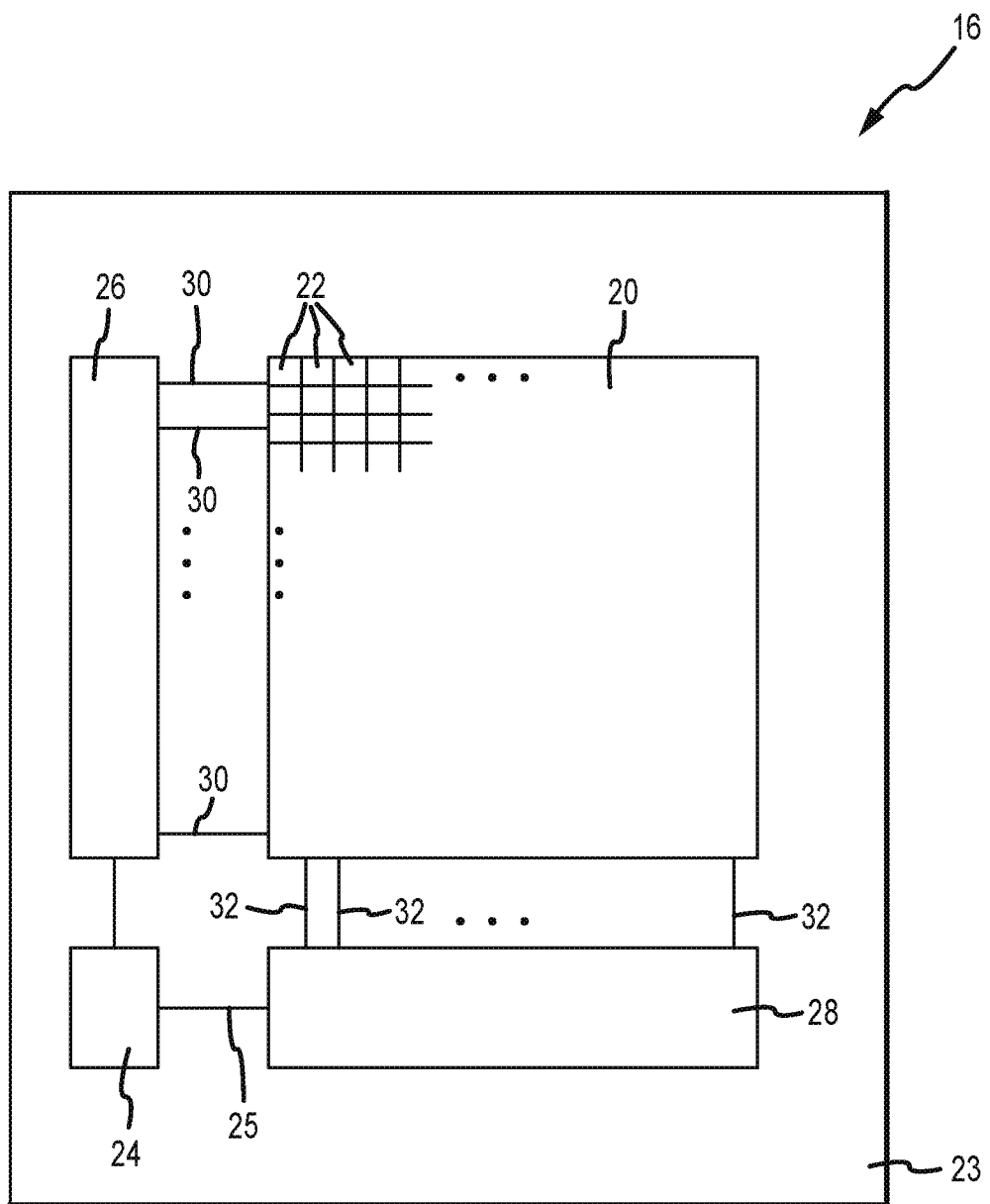
FIG. 2 is a diagram of an illustrative pixel array and associated readout circuitry for reading out image signals from the pixel array in accordance with an embodiment.

As shown in FIG. 2, image sensor 16 may include pixel array 20 containing image sensor pixels 22 arranged in rows and columns (sometimes referred to herein as image pixels or pixels), and control and processing circuitry 24 (which may include, for example, image signal processing circuitry). Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry). Pixel array 20, control and processing circuitry 24, row control circuitry 26, and image readout circuitry 28 may be formed on a substrate 23. If desired, some or all of the components of image sensor 16 may instead be formed on substrates other than substrate 23, which may be connected to substrate 23, for instance, through wire bonding or flip-chip bonding.

Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 over path 25 for pixels in one or more pixel columns.

Figure 3A:
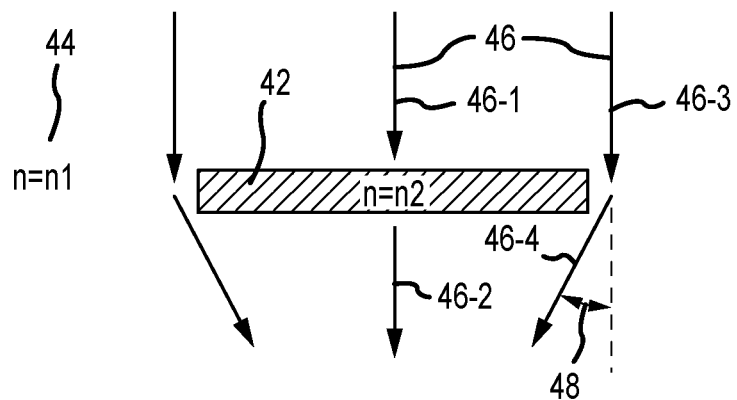
FIG. 3A is a cross-sectional side view of an illustrative focusing diffractive lens with a greater index of refraction than the surrounding medium in accordance with an embodiment.
Figure 3B:
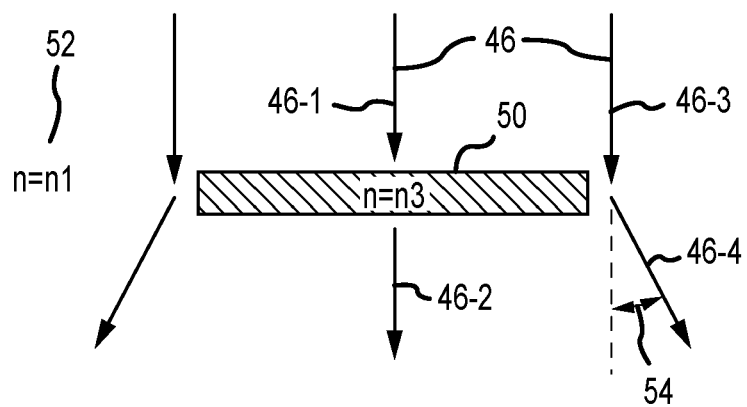
FIG. 3B is a cross-sectional side view of an illustrative defocusing diffractive lens with a lower index of refraction than the surrounding medium in accordance with an embodiment.

FIGS. 3A and 3B are cross-sectional side views of illustrative diffractive lenses that may be used in image sensors. As shown in FIG. 3A, a diffractive lens 42 may be formed in a surrounding medium 44. The surrounding material 44 may be formed from a first material that has a first index of refraction (n1). Diffractive lens 42 may be formed from a second material that has a second index of refraction (n2). In the example of FIG. 3A, the index of refraction of the lens may be greater than the index of refraction of the surrounding material (i.e., n2>n1). This results in incident light being focused towards a focal point. In this arrangement, diffractive lens 42 acts as a convex lens.

Lens 42 may be transparent to incident light. Therefore, some light may pass through the lens without being focused. For example, incident light 46-1 may pass through the center of diffractive lens 42. The corresponding light 46-2 on the other side of the diffractive lens may travel in the same direction as incident light 46-1. In contrast, incident light at the edge of diffractive lens 42 may be redirected due to diffraction. For example, incident light 46-3 may pass by the edge of diffractive lens 42. The light may be redirected such that the output light 46-4 travels at an angle 48 relative to the incident light 46-3. In other words, the diffractive lens redirects the light at the edge of the lens using diffraction.

Diffraction occurs when a wave (such as light) encounters an obstacle. When light passes around the edge of an object, it will be bent or redirected such that the direction of the original incident light changes. The amount and direction of bending depends on numerous factors. In an imaging sensor, diffraction of light can be used (with diffractive lenses) to redirect incident light in desired ways (i.e., focusing incident light on photodiodes to mitigate optical cross-talk).

In the example of FIG. 3A, diffractive lens 42 has an index of refraction greater than the index of refraction of the surrounding medium 44. This causes incident light to be focused towards a focal point. However, this example is merely illustrative and other embodiments may be used.

As shown in FIG. 3B, a diffractive lens 50 may be formed in a surrounding medium 52. The surrounding material 52 may be formed from a first material that has a first index of refraction (n1). Diffractive lens 50 may be formed from a third material that has a third index of refraction (n3). In the example of FIG. 3B, the index of refraction of the lens may be less than the index of refraction of the surrounding material (i.e., n1>n3). This results in incident light 46 being defocused. In this arrangement, diffractive lens 50 acts as a concave lens.

Lens 50 may be transparent to incident light. Therefore, some light may pass through the lens without being focused. For example, incident light 46-1 may pass through the center of diffractive lens 50. The corresponding light 46-2 on the other side of the diffractive lens may travel in the same direction as incident light 46-1. In contrast, incident light at the edge of diffractive lens 50 may be redirected due to diffraction. For example, incident light 46-3 may pass by the edge of diffractive lens 50. The light may be redirected such that the output light 46-4 travels at an angle 54 relative to the incident light 46-3. In other words, the diffractive lens redirects the light at the edge of the lens using diffraction.

Figure 4A:
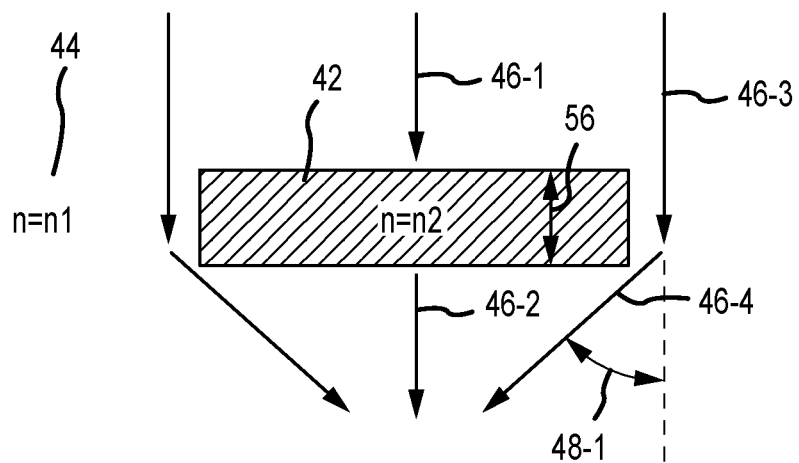
FIGS. 4A and 4B are cross-sectional side views of illustrative diffractive lenses showing how the thickness of the diffractive lens may be adjusted to change the response to incident light in accordance with an embodiment.
Figure 4B:
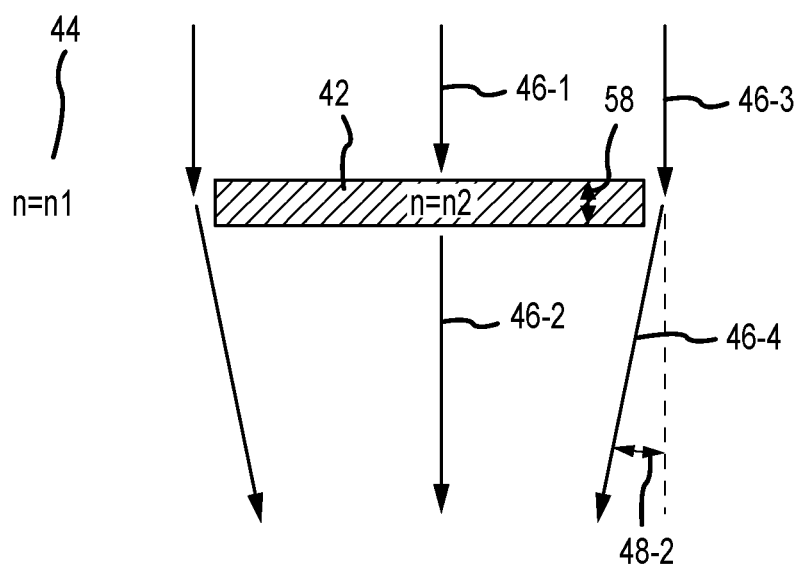

In addition to the refractive indexes of the diffractive lens and the surrounding material, the thickness of the diffractive lens may also affect the response of incident light to the diffractive lens. FIGS. 4A and 4B show illustrative diffractive lenses used to focus incident light (as in FIG. 3A, for example). As shown in FIG. 4A, a diffractive lens 42 may be formed in a surrounding medium 44. The surrounding material 44 may be formed from a first material that has a first index of refraction (n1). Diffractive lens 42 may be formed from a second material that has a second index of refraction (n2). In the example of FIG. 4A, the index of refraction of the lens may be greater than the index of refraction of the surrounding material (i.e., n2>n1). This results in the light being focused to a focal point.

In particular, incident light 46-3 may pass by the edge of diffractive lens 42. The light may be redirected such that the output light 46-4 travels at an angle 48-1 relative to the incident light 46-3. This angle may be dependent upon the thickness 56 of diffractive lens 42. In the example of FIG. 4A, thickness 56 is associated with an angle of diffraction of 48-1. Diffractive lens 42 in FIG. 4A may have a relatively large thickness and, accordingly, a relatively large angle of diffraction 48-1.

In contrast, diffractive lens 42 in FIG. 4B may have a relatively small thickness and a relatively small angle of diffraction 48-2. As shown in FIG. 4B, a diffractive lens 42 may be formed in a surrounding medium 44. The surrounding material 44 may be formed from a first material that has a first index of refraction (n1). Diffractive lens 42 may be formed from a second material that has a second index of refraction (n2). In the example of FIG. 4B, the index of refraction of the lens may be greater than the index of refraction of the surrounding material (i.e., n2>n1). This results in the light being focused to a focal point. In particular, the light at the edge of the diffractive lens may be redirected such that the output light 46-4 travels at an angle 48-2 relative to the incident light 46-3. This angle may be dependent upon the thickness 58 of diffractive lens 42. Because thickness 58 in FIG. 4B is less than thickness 56 in FIG. 4A, angle 48-2 in FIG. 4B is less than angle 48-1 in FIG. 4A.

Diffractive lenses 42 in FIGS. 4A and 4B have the same length and width. However, the length and width of diffractive lenses may also be adjusted to alter the response of incident light 46.

This shows how diffractive lenses may be used to redirect incident light in desired ways. The refractive indexes of the lens and surrounding material may be altered to customize the response of incident light. Additionally, the thickness, length, and width, of the diffractive lens may be altered to customize the response of incident light.

Figure 5:
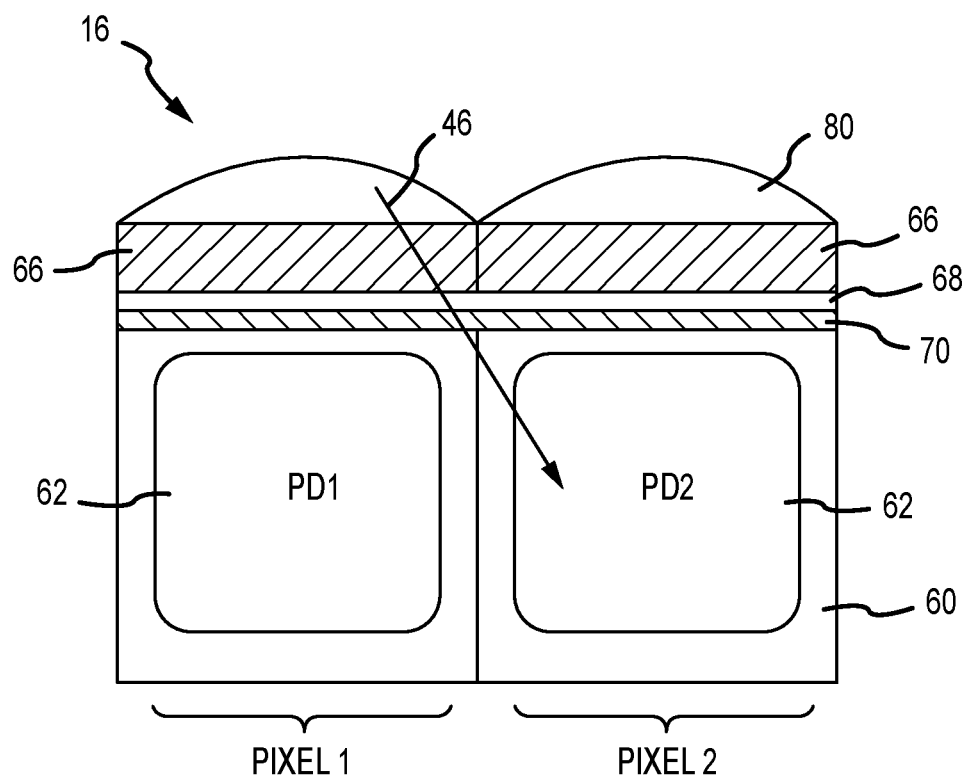
FIG. 5 is a cross-sectional side view of an illustrative image sensor without diffractive lenses in accordance with an embodiment.

FIG. 5 is a cross-sectional side view of an illustrative image sensor without diffractive lenses. Image sensor 16 may include first and second pixels such as Pixel 1 and Pixel 2. Pixel 1 and Pixel 2 may include photosensitive regions 62 formed in a substrate such as silicon substrate 60. For example, Pixel 1 may include an associated photosensitive region such as photodiode PD1, and Pixel 2 may include an associated photosensitive region such as photodiode PD2.

Color filters such as color filter elements 66 (sometimes referred to as color filter layer 66) may be interposed between microlenses 80 and substrate 60. Color filter elements 66 may filter incident light by only allowing predetermined wavelengths to pass through color filter elements 66 (e.g., color filter 66 may only be transparent to the certain ranges of wavelengths). Color filter elements 66 may be part of a color filter array formed on the back surface of substrate 60. A respective microlens 80 may cover each color filter element 66 in the color filter array. Light can enter from the back side of the image pixels through microlenses 80. While in FIG. 5 image sensor 16 is a back-side illuminated image sensor, image sensor 16 may instead be a front-side illuminated image sensor if desired. Photodiodes PD1 and PD2 may serve to absorb incident light focused by microlenses 80 and produce pixel signals that correspond to the amount of incident light absorbed.

Color filters 66 may include green filters, red filters, blue filters, yellow filters, cyan filters, magenta filters, clear filters, infrared filters, or other types of filters. As an example, a green filter passes green light (e.g., light with wavelengths from 495 nm to 570 nm) and reflects and/or absorbs light out of that range (e.g., the green filter reflects red light and blue light). An example of a color filter array pattern that may be used is the GRBG (green-red-blue-green) Bayer pattern. In this type of configuration, the color filter array is arranged into groups of four color filters. In each group, two of the four color filters are green filters, one of the four color filters is a red filter, and the remaining color filter is a blue filter. If desired, other color filter array patterns may be used.

One or more additional layers may be interposed between substrate 60 and microlenses 80. As shown in FIG. 5, image sensor 16 may include a planarization layer 70 and an anti-reflective coating (ARC) 68 interposed between substrate 60 and microlenses 80. In the example of FIG. 5, the planarization layer 70 and anti-reflective coating 68 are interposed between color filter elements 66 and substrate 60. Planarization layer 70 (sometimes referred to as a planarization layer, passivation layer, dielectric layer, film, planar film, or planarization film) and anti-reflective coating 68 may be formed across the entire array of imaging pixels in image sensor 16. Anti-reflective coating 68 and planarization layer 70 may be transparent and may be formed from any desired materials.

FIG. 5 shows incident light 46 passing through the color filter element of Pixel 1 into the photodiode PD2 of Pixel 2. This type of optical cross-talk between pixels is undesirable. To prevent optical cross-talk and improve imaging performance, image sensor 16 may include diffractive lenses. An arrangement of this type is shown in FIG. 6.

Figure 6:
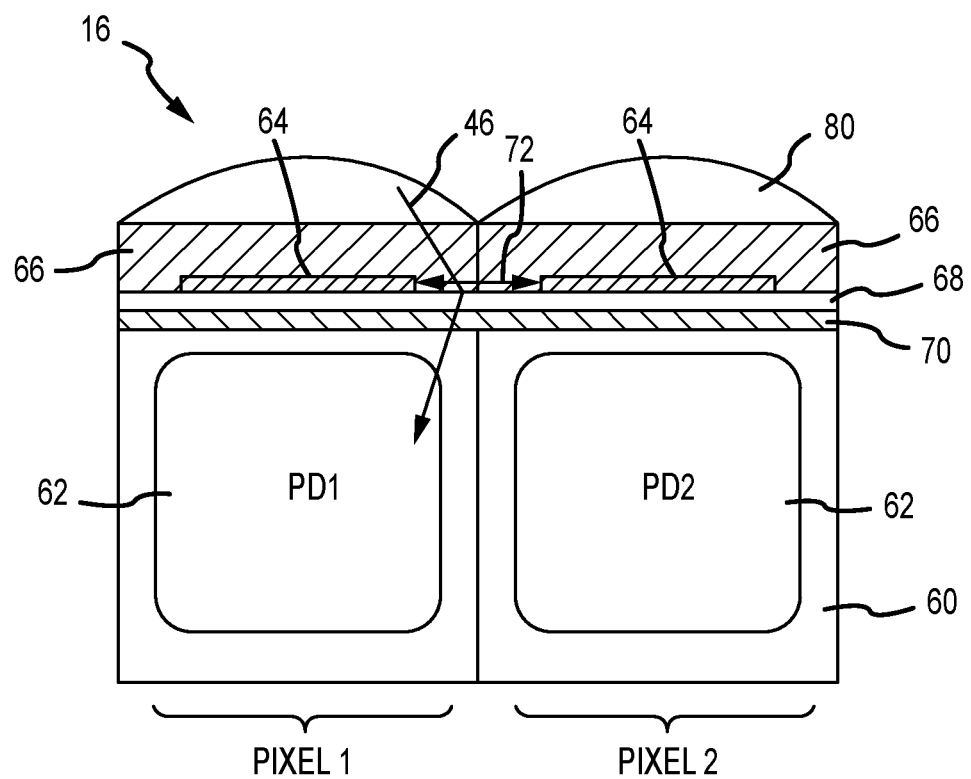
FIG. 6 is a cross-sectional side view of an illustrative image sensor with diffractive lenses in accordance with an embodiment.

FIG. 6 is a cross-sectional side view of an image sensor 16 with diffractive lenses 64. Diffractive lenses 64 may be formed over photodiodes PD1 and PD2 and may be used to direct incident light towards photodiodes PD1 and PD2 (e.g., diffractive lenses 64 may be focusing diffractive lenses of the type shown in FIG. 3A). As shown in FIG. 6, incident light 46 that passes through the color filter element 66 of Pixel 1 may be redirected by diffractive lens 64 to reach the photodiode PD1 of Pixel 1 (instead of the photodiode PD2 of Pixel 2 as in FIG. 5).

As shown in FIG. 6, image sensor 16 may include a planarization layer 70 and an anti-reflective coating (ARC) 68 interposed between substrate 60 and microlenses 80. In the example of FIG. 6, the planarization layer 70 and anti-reflective coating 68 are interposed between diffractive lenses 64 and substrate 60. Color filter elements 66 may be formed over diffractive lenses 64. In one example (as shown in FIG. 6), color filter elements 66 may conformally cover diffractive lenses 64 such that the upper surfaces and side surfaces of diffractive lenses 64 are in contact with color filter layer 66.

Diffractive lenses 64 may be formed from any desired material. Diffractive lenses 64 may be located anywhere between the microlens and the photodiode. It may be desirable for diffractive lenses 64 to be transparent and formed from a material with a higher refractive index than the surrounding materials. Diffractive lenses 64 may sometimes be formed from silicon nitride (with a refractive index of approximately 1.9). In general, diffractive lenses 64 may have any desired index of refraction (e.g., between 1.8 and 2.0, between 1.6 and 2.2, between 1.5 and 2.5, between 1.5 and 2.0, more than 1.3, more than 1.6, more than 1.8, more than 2.0, less than 2.0, less than 1.8, etc.).

Diffractive lenses 64 may be formed from the same material as adjacent layers if desired (e.g., diffractive lenses 64 may be formed from the same material as anti-reflective coating 68, planarization layer 70, or color filter layer 66 if desired).

Planarization layer 70 may also be transparent and may be formed from a material with any desired refractive index (e.g., a refractive index greater than, less than, or equal to the refractive index of diffractive lenses 64). Planar layer 70 may be formed from a material with a refractive index between 1.3 and 1.5, between 1.2 and 1.8, greater than 1.3, greater than 1.2, greater than 1.1, less than 2.0, less than 1.9, less than 2.5, between 1.5 and 2.2, or any other desired refractive index. Anti-reflective coating 68 may also be transparent and may be formed from a material with any desired refractive index (e.g., a refractive index greater than, less than, or equal to the refractive index of diffractive lenses 64). Anti-reflective coating 68 may be formed from a material with a refractive index between 1.3 and 1.5, between 1.2 and 1.8, greater than 1.3, greater than 1.2, greater than 1.1, less than 2.0, less than 1.9, less than 2.5, between 1.5 and 2.2, or any other desired refractive index. The material of color filter layer 66 may have any desired refractive index (e.g., a refractive index greater than, less than, or equal to the refractive index of diffractive lenses 64). Color filter layer 66 may be formed from material(s) with a refractive index between 1.3 and 1.5, between 1.2 and 1.8, greater than 1.3, greater than 1.2, greater than 1.1, less than 2.0, less than 1.9, less than 2.5, between 1.5 and 2.2, or any other desired refractive index.

Diffractive lenses 64 may have a higher index of refraction than the surrounding materials (e.g., color filter elements 66 and anti-reflective coating 68) if desired. Accordingly, light passing by the edge of diffractive lenses 64 may be focused towards the photodiodes of the pixels.

As previously discussed, the refractive indexes of the diffractive lenses and surrounding materials, as well as the dimensions of the diffractive lenses, may be altered to customize the response to incident light. Additionally, the distance 72 between each diffractive lens may be altered to change the response of incident light.

In some embodiments, the diffractive lens over each pixel in the pixel array may be the same. However, in other embodiments different pixels may have unique diffractive lenses to further customize the response to incident light.

Figure 7:
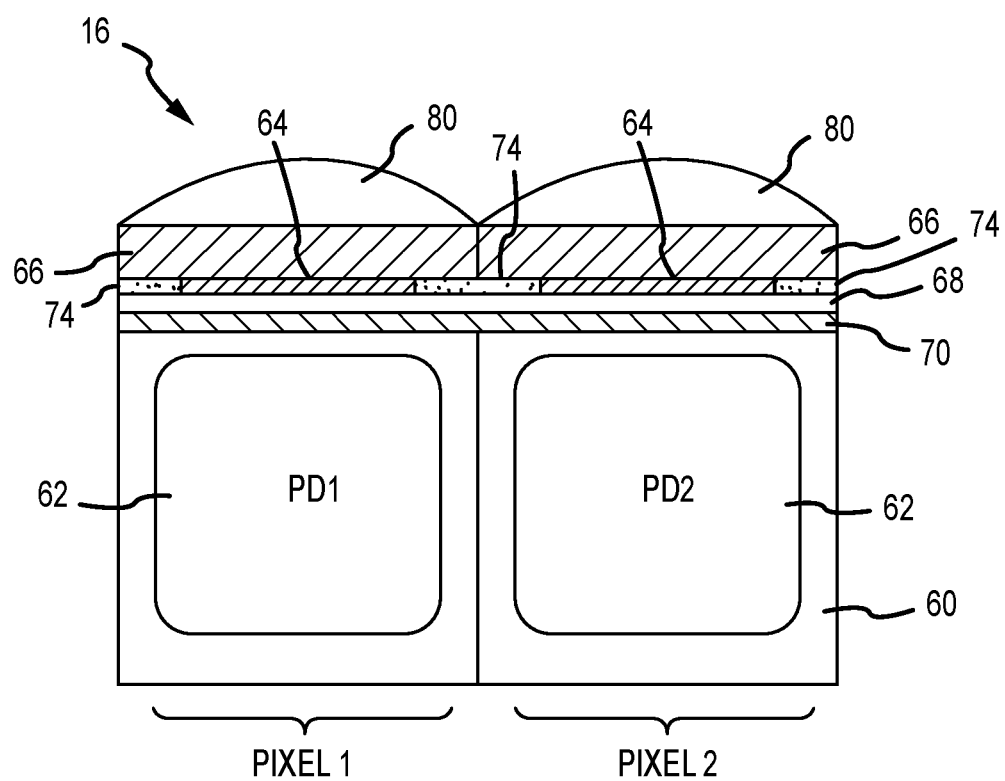
FIG. 7 is a cross-sectional side view of an illustrative image sensor with diffractive lenses surrounded by a lower refractive index material in accordance with an embodiment.

In FIG. 6, diffractive lenses 64 are formed on anti-reflective coating 68, with color filter layer 66 conformally covering the diffractive lenses. This example is merely illustrative, and other arrangements may be used if desired. As shown in FIG. 7, diffractive lenses 64 may be interposed between color filter elements 66 and anti-reflective coating 68 with an additional layer 74 interposed between adjacent diffractive lenses. In other words, diffractive lenses 64 may have opposing upper and lower surfaces that are connected by side surfaces. The upper surfaces of the diffractive lenses may be adjacent to (e.g., contact) color filter elements 66. The lower surfaces of the diffractive lenses may be adjacent to (e.g., contact) anti-reflective coating 68. Additional layer 74 may be adjacent to (e.g., contact) the side surfaces of diffractive lenses 64. Additional layer 74 may be transparent and may have a refractive index that is less than the refractive index of the diffractive lenses.

If desired, additional material may be interposed between the upper surfaces of diffractive lenses 64 and color filter elements 66. In one illustrative arrangement, the diffractive lenses may be embedded in (e.g., completely surrounded by) a separate layer (e.g., a planarization layer or anti-reflection coating) with a lower refractive index than the refractive index of the diffractive lenses.

Diffractive lenses 64 may be formed from the same material as adjacent layers if desired (e.g., diffractive lenses 64 may be formed from the same material as anti-reflective coating 68, planarization layer 70, or color filter layer 66 if desired). Similarly, layer 74 may be formed from the same material as adjacent layers if desired (e.g., layer 74 may be formed from the same material as anti-reflective coating 68, planarization layer 70, or color filter layer 66 if desired). For example, layer 74 may be formed from the same material as color filter elements 66 (as shown in FIG. 6, for example).

Figure 8:
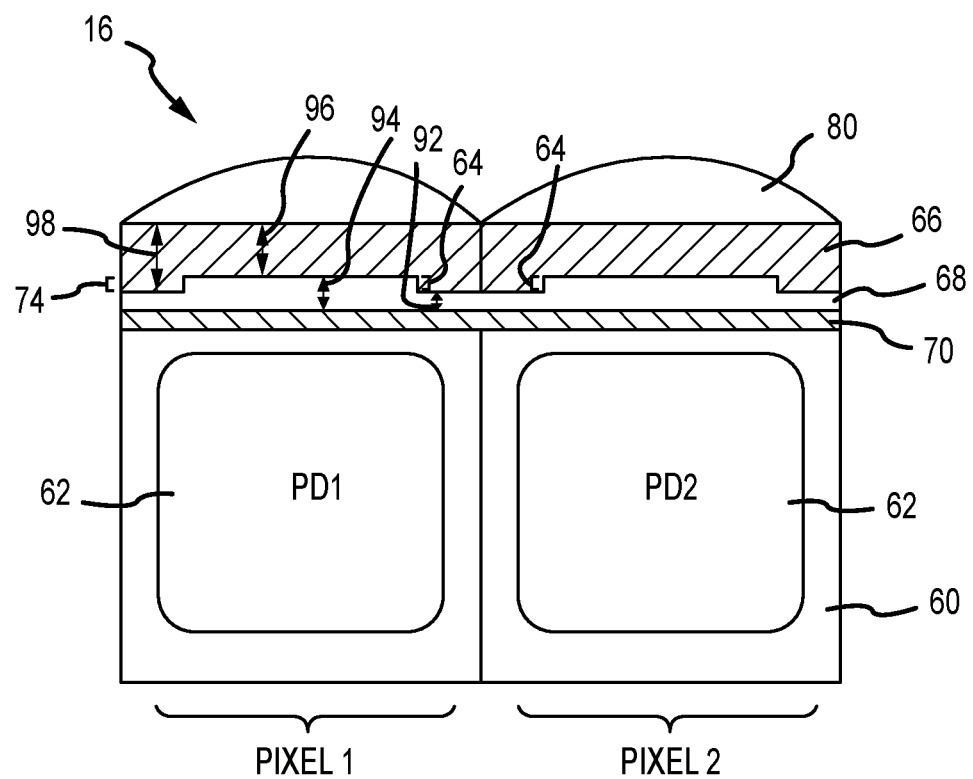
FIG. 8 is a cross-sectional side view of an illustrative image sensor with diffractive lenses formed from the same material as an underlying anti-reflective coating in accordance with an embodiment.

FIG. 8 is a cross-sectional side view of an illustrative image sensor with diffractive lenses formed from the anti-reflective coating material of anti-reflective coating 68. As shown in FIG. 8, anti-reflective coating 68 has a first thickness 92 and a second thickness 94 that is greater than the first thickness. The portions of anti-reflective coating 68 with the second thickness 94 may form diffractive lenses 64. In other words, diffractive lenses 64 in FIG. 8 are formed from the same material as anti-reflective coating 68. Diffractive lenses 64 may be considered to be formed separately from and from the same material as anti-reflective coating 68 or may be considered to be a portion of anti-reflective coating 68.

Color filter layer 66 may have a first thickness 96 in portions above diffractive lenses 64 and a second thickness 98 (that is greater than the first thickness) in portions not above diffractive lenses 64. In other words, layer 74 (e.g., layer 74 in FIG. 7) may be formed from the same material as color filter elements 66. Layer 74 may be considered to be formed separately from and from the same material as color filter elements 66 or may be considered to be a portion of color filter elements 66.

As shown in FIGS. 6-8, the diffractive lenses may be positioned above a corresponding photodiode such that light at the edges of the photodiodes is directed to the proper photodiode (e.g., the diffractive lenses 64 may have outer edges close to the pixel boundary). For example, diffractive lenses 64 may have outer edges within 1 micron of the pixel boundary, within 10 microns of the pixel boundary, within 100 microns of the pixel boundary, within 1000 microns of the pixel boundary, within 0.1 microns of the pixel boundary, within 0.01 microns of the pixel boundary, between 0.01 microns and 1 microns of the pixel boundary, between 0.01 microns and 0.5 microns of the pixel boundary, between 0.01 microns and 0.2 microns of the pixel boundary, between 0.01 microns and 0.1 microns of the pixel boundary, etc. However, it should be noted that the diffractive lenses may be positioned such that the outer edges are close to the effective pixel boundary (e.g., accounting for the angle of incidence of incident light). For example, diffractive lenses 64 may have outer edges within 1 micron of the effective pixel boundary, within 10 microns of the effective pixel boundary, within 100 microns of the effective pixel boundary, within 1000 microns of the effective pixel boundary, within 0.1 microns of the effective pixel boundary, within 0.01 microns of the effective pixel boundary, between 0.01 microns and 1 microns of the effective pixel boundary, between 0.01 microns and 0.5 microns of the effective pixel boundary, between 0.01 microns and 0.2 microns of the effective pixel boundary, between 0.01 microns and 0.1 microns of the effective pixel boundary, etc.

Figure 9:
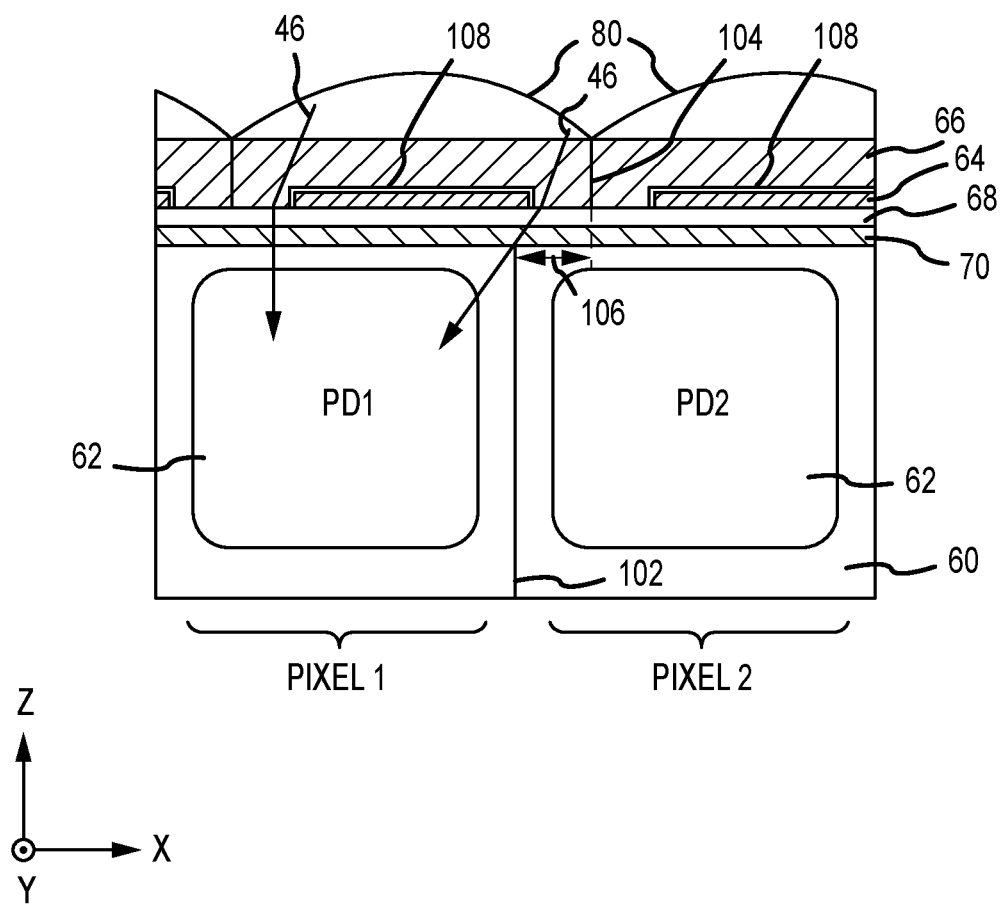
FIG. 9 is a cross-sectional side view of an illustrative image sensor with diffractive lenses that are shifted relative to the underlying photodiodes in accordance with an embodiment.

FIG. 9 is a cross-sectional side view of an image sensor with diffractive lenses that are shifted relative to the underlying photodiode to account for the angle of incidence of incident light. As shown in FIG. 9, there is a boundary 102 (sometimes referred to as interface 102 or pixel boundary 102) between Pixel 1 and Pixel 2 in substrate 60 (e.g., boundary 102 is interposed between photodiode PD1 and photodiode PD2). Similarly, there is a boundary 104 (sometimes referred to as interface 104) between the color filter element 66 associated with Pixel 1 and the color filter element 66 associated with Pixel 2. In FIGS. 6-8, these boundaries are aligned (e.g., overlap in the Z-direction). However, in FIG. 9 the color filter interface 104 may be shifted relative to pixel boundary 102 (e.g. in the positive X-direction) by distance 106. This may account for the angle of incidence of incident light 46. For example, Pixel 1 and Pixel 2 of FIG. 9 may be positioned at an edge of the image sensor (such that the origin point of incident light 46 will be biased in the positive-X direction as opposed to the negative-X direction). Shifting color filter elements 66 as shown in FIG. 9 will ensure that incident light that passes through a color filter element of a pixel reaches the photodiode associated with that pixel.

Diffractive lenses 64 may also be shifted relative to photodiodes 62, as shown in FIG. 9. For example, in FIGS. 6-8 the centers of diffractive lenses 64 are aligned with the centers of photodiodes 62. In FIG. 9, the centers of diffractive lenses 64 are not aligned with the centers of photodiodes 62. The centers of diffractive lenses 64 may be aligned with the centers of color filter elements 66 in both FIGS. 6-8 and FIG. 9 (e.g., regardless of the shift of color filter elements 66). The outer edges of diffractive lenses 74 may be close to the effective pixel boundary (e.g., boundary 104) as opposed to boundary 102.

The arrangement of FIG. 9 is merely illustrative. In general, each color filter element and diffractive lens for a respective pixel may be shifted by any desired amount relative to the photodiode for the pixel. The color filter element and diffractive lens may be interposed in an optical path between microlens 80 and photodiode 62.

As discussed in connection with FIG. 8, diffractive lenses 64 may be formed from the same material as anti-reflective coating 68. Additionally, as shown in FIG. 9, an additional anti-reflective coating 108 (sometimes referred to as a diffractive lens anti-reflective coating) may be formed on one or more surfaces of diffractive lenses 64. The additional anti-reflective coating 108 may optionally be applied to any of the diffractive lenses of FIGS. 6-9.

Additional structures that prevent optical cross-talk may be incorporated into any of the image sensors shown in FIGS. 6-9 if desired. For example, substrate 60 of FIGS. 6-9 may include deep trench isolation structures or shallow trench isolation structures (e.g., isolation material formed in trenches) between adjacent photodiodes (e.g., at boundary 102 in FIG. 9). Additionally, color filter layer 66 of FIGS. 6-9 may include structures between adjacent color filter elements. For example, one or more dielectric materials and/or one or more conductive materials (e.g., tungsten) may be formed between adjacent color filter elements. These types of arrangements may be referred to as color filter in a box (CIAB) arrangements.

In the embodiments of FIGS. 6-9, one diffractive lens is formed over each pixel. These examples are merely illustrative. If desired, more than one diffractive lens may be formed over each image pixel. In one embodiment, multiple diffractive lenses may be formed over each pixel (e.g., between the pixel's photodiode and microlens). Every diffractive lens of the multiple diffractive lenses may have a refractive index greater than the refractive index of the surrounding layer(s) or every diffractive lens of the multiple diffractive lenses may have may have a refractive index lower than the refractive index of the surrounding layer(s). In yet another embodiment, one or more diffractive lenses of the multiple diffractive lenses may have a refractive index lower than the refractive index of the surrounding layer(s) whereas one or more diffractive lenses of the multipole diffractive lenses may have a refractive index greater than the refractive index of the surrounding layer(s) (e.g., there may be one or more defocusing lenses and one or more focusing lenses over each pixel).

Figure 10A:
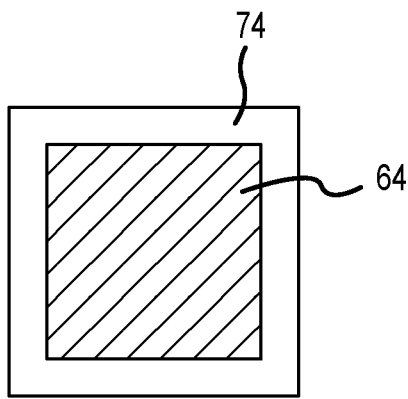
FIGS. 10A-10E are top views of illustrative diffractive lenses showing different shapes for the diffractive lenses in accordance with an embodiment.
Figure 10B:
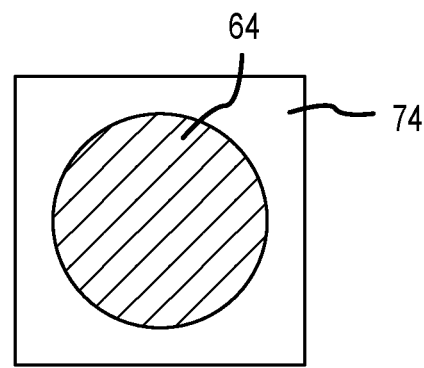
Figure 10C:
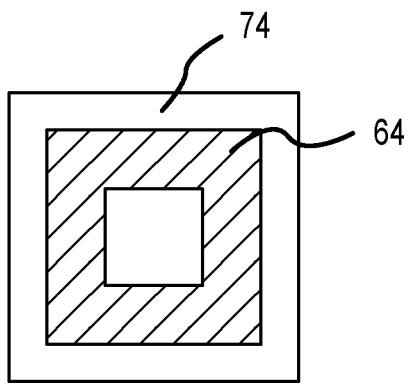
Figure 10D:
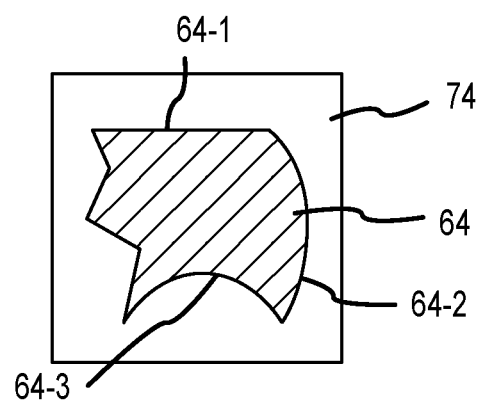
Figure 10E:
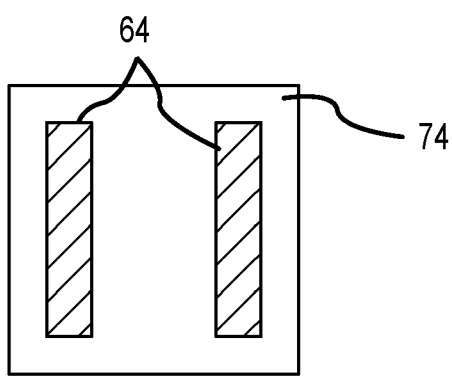

As previously mentioned, each diffractive lens 64 may have any desired shape. FIGS. 10A-10E are top views of illustrative diffractive lenses with different shapes. FIGS. 10A-10E show diffractive lenses as being surrounded by layer 74. As discussed in connection with FIG. 8, layer 74 may be formed from the same material as layers adjacent to diffractive lens 64 if desired (e.g., layer 74 may be formed from the same material as anti-reflective coating 68, planarization layer 70, or color filter layer 66 if desired). As shown in FIG. 10A, diffractive lens 64 may have a rectangular (or square) shape. As shown in FIG. 10B, diffractive lens 64 may be formed from a shape with curved edges such as a circle or oval. In the embodiments of FIGS. 10A and 10B, diffractive lens 64 does not have any openings. However, these examples are merely illustrative. As shown in FIG. 10C, diffractive lens 64 may have one or more openings such that the lens is ring-shaped (e.g., annular). As shown in FIG. 10D, the diffractive lens does not have to be a regular shape. FIG. 10D shows an irregularly shaped diffractive lens. The diffractive lens may include one or more planar sides (i.e., 64-1), one or more curved sides that curve outward (i.e., 64-2), and/or one or more curved sides that curve inward (i.e., 64-3). Finally, as shown in FIG. 10E, the diffractive lens may be split into more than one section. The diffractive lens may have two or more separately formed vertical sections or two or more separately formed horizontal sections.

In various embodiments, an image sensor may include a plurality of imaging pixels. Each imaging pixel of the plurality of imaging pixels may include a photodiode, a microlens formed over the photodiode, and a diffractive lens interposed between the photodiode and the microlens. The diffractive lens of each imaging pixel may have a planar upper surface and a planar lower surface. The image sensor may also include a planarization layer that is formed over the plurality of imaging pixels between the photodiodes of the imaging pixels and the diffractive lenses of the imaging pixels.

The image sensor may also include an anti-reflective coating that is formed over the plurality of imaging pixels between the photodiodes of the imaging pixels and the diffractive lenses of the imaging pixels. Each imaging pixel may also include a color filter element interposed between the respective diffractive lens and the respective microlens. The diffractive lens of each imaging pixel may be formed from a portion of the anti-reflective coating. The color filter element of each imaging pixel may be formed in direct contact with an upper surface and a side surface of the respective diffractive lens. The anti-reflective coating may have first portions with a first thickness and second portions with a second thickness that is greater than the first thickness and the second portions of the anti-reflective coating may form the diffractive lenses of the plurality of imaging pixels. The diffractive lens of each imaging pixel may have a first refractive index and the diffractive lens of each imaging pixel may be surrounded by a respective layer of material that has a second refractive index that is less than the first refractive index. The respective layer of material for each imaging pixel may form a portion of a respective color filter element for that imaging pixel.

In various embodiments, an imaging pixel may include a photosensitive area, a color filter element formed over the photosensitive area, a microlens formed over the color filter element, and a diffractive lens formed between the color filter element and the photosensitive area. The diffractive lens may be transparent, the diffractive lens may have first and second opposing surfaces, and the first and second surfaces of the diffractive lens may be planar.

Light incident on a central portion of the diffractive lens may pass through the diffractive lens without being redirected and light incident on an edge portion of the diffractive lens may be redirected by the diffractive lens towards the photosensitive area. The imaging pixel may also include a layer of material that surrounds the diffractive lens. The diffractive lens may have a first refractive index and the layer of material may have a second refractive index that is less than the first refractive index. The layer of material may form a portion of the color filter element.

The imaging pixel may also include an anti-reflective coating interposed between the diffractive lens and the photosensitive area. The diffractive lens may be formed from the same material as the anti-reflective coating. The imaging pixel may also include an anti-reflective coating on the diffractive lens. The diffractive lens may have a center, the photosensitive area may have a center, and the center of the diffractive lens may be shifted relative to the center of the photosensitive area. The color filter element may have a center and the center of the diffractive lens may be aligned with the center of the color filter element.

In various embodiments, an image sensor may include a plurality of imaging pixels. Each imaging pixel of the plurality of imaging pixels may include a photosensitive area, a microlens, and a planar diffractive lens formed between the photosensitive area and the microlens. The planar diffractive lens may focus incident light onto the photosensitive area. The planar diffractive lens of each imaging pixel may be surrounded by at least one layer and the planar diffractive lens of each imaging pixel may have a greater index of refraction than the at least one layer.

The foregoing is merely illustrative of the principles of this invention and various modifications can be made by those skilled in the art without departing from the scope and spirit of the invention.

What is claimed is:

1. An image sensor comprising a plurality of imaging pixels, wherein each imaging pixel of the plurality of imaging pixels comprises:
    a photodiode;
    a color filter element formed over the photodiode that has a first portion with a first thickness and a second portion with a second thickness that is greater than the first thickness; and
    a diffractive lens that is formed over the photodiode and that has a first refractive index, wherein the second portion of the color filter element is formed around the diffractive lens and has a second refractive index that is different than the first refractive index.

2. The image sensor defined in claim 1, wherein the diffractive lens of each imaging pixel has a planar upper surface and a planar lower surface.

3. The image sensor defined in claim 1, further comprising:
    a planarization layer that is formed over the plurality of imaging pixels between the photodiodes of the imaging pixels and the diffractive lenses of the imaging pixels.

4. The image sensor defined in claim 1, further comprising:
    an anti-reflective coating that is formed over the plurality of imaging pixels between the photodiodes of the imaging pixels and the diffractive lenses of the imaging pixels.

5. The image sensor defined in claim 1, wherein each imaging pixel further comprises:
    an anti-reflective coating on the diffractive lens.

6. The image sensor defined in claim 1, wherein the second portion of the color filter element of each imaging pixel directly contacts an edge surface of the diffractive lens of that imaging pixel.

7. The image sensor defined in claim 6, wherein the first portion of the color filter element of each imaging pixel directly contacts a selected one of an upper surface and a lower surface of the diffractive lens of that imaging pixel.

8. An image sensor comprising:
    a photodiode;
    a diffractive lens formed over the photodiode; and
    an anti-reflective coating that is formed over the photodiode, wherein the anti-reflective coating has a first portion that is interposed between the diffractive lens and the photodiode and a second portion that is formed around the diffractive lens.

9. The image sensor defined in claim 8, wherein the first portion of the anti-reflective coating has a first thickness and wherein the second portion of the anti-reflective coating has a second thickness that is greater than the first thickness.

10. The image sensor defined in claim 8, wherein the diffractive lens has a first index of refraction and wherein the anti-reflective coating has a second index of refraction that is different than the first index of refraction.

11. The image sensor defined in claim 8, wherein the diffractive lens has a center, the photodiode has a center, and the center of the diffractive lens is shifted relative to the center of the photodiode.

12. The image sensor defined in claim 8, further comprising:
    a color filter element that is formed over the diffractive lens.

13. The image sensor defined in claim 12, further comprising:
    a microlens that is formed over the color filter element.

14. The image sensor defined in claim 8, wherein the diffractive lens has a perimeter and wherein the second portion of the anti-reflective coating is formed around the perimeter.

15. An imaging pixel comprising:
    a photosensitive area;
    a color filter element formed over the photosensitive area; and
    an anti-reflective coating formed over the photosensitive area, wherein the anti-reflective coating has an increased thickness portion that forms a diffractive lens.

16. The imaging pixel defined in claim 15, wherein the anti-reflective coating has a first index of refraction and the color filter element has a second index of refraction that is different than the first refractive index.

17. The imaging pixel defined in claim 16, wherein the color filter element has an increased thickness portion that laterally surrounds the increased thickness portion of the anti-reflective coating.

18. The imaging pixel defined in claim 15, wherein the diffractive lens has a center, the photosensitive area has a center, and the center of the diffractive lens is shifted relative to the center of the photosensitive area.

19. The imaging pixel defined in claim 15, wherein the color filter element has a first portion with a first thickness and a second portion with a second thickness that is greater than the first thickness.

20. The imaging pixel defined in claim 19, wherein the first portion is formed over the diffractive lens and wherein the second portion laterally surrounds the diffractive lens.

* * * * *